(12) United States Patent
Tabata

(10) Patent No.: US 12,051,595 B2
(45) Date of Patent: Jul. 30, 2024

(54) PLASMA PROCESSING METHOD AND PLASMA PROCESSING APPARATUS

(71) Applicant: TOKYO ELECTRON LIMITED, Tokyo (JP)

(72) Inventor: Masahiro Tabata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 239 days.

(21) Appl. No.: 17/669,944

(22) Filed: Feb. 11, 2022

(65) Prior Publication Data
US 2022/0165579 A1 May 26, 2022

Related U.S. Application Data

(62) Division of application No. 16/522,933, filed on Jul. 26, 2019, now Pat. No. 11,289,339.

(30) Foreign Application Priority Data

Jul. 27, 2018 (JP) .................................. 2018-141742

(51) Int. Cl.
*H01J 37/32* (2006.01)
*H01L 21/02* (2006.01)
(Continued)

(52) U.S. Cl.
CPC .. *H01L 21/31116* (2013.01); *H01J 37/32449* (2013.01); *H01L 21/0212* (2013.01);
(Continued)

(58) Field of Classification Search
CPC ... C23C 16/50; C23C 16/509; C23C 16/4584; C23C 16/45565; C23C 16/45563;
(Continued)

(56) References Cited

U.S. PATENT DOCUMENTS 7,824,975 B2 * 11/2010 Joung ............. H01L 21/823468
257/E21.632
2012/0149200 A1 * 6/2012 Culp ................. H01L 21/76237
257/E21.249
(Continued)

FOREIGN PATENT DOCUMENTS

TW 367578 B 8/1999
TW 201618189 A 5/2016

*Primary Examiner* — Rudy Zervigon
(74) *Attorney, Agent, or Firm* — XSENSUS LLP

(57) ABSTRACT

A plasma processing method executed by a plasma processing apparatus includes a first step, a second step, and an etching step. In the first step, the plasma processing apparatus forms a first film on a processing target in which a plurality of openings having a predetermined pattern are formed. In the second step, the plasma processing apparatus forms a second film having an etching rate lower than that of the first film on the processing target on which the first film is formed, and having different film thicknesses on the side surfaces of the openings according to the sizes of the openings. In the etching step, the plasma processing apparatus performs etching from above the second film under a predetermined processing condition until a portion of the first film is removed from at least a portion of the processing target.

20 Claims, 10 Drawing Sheets

(51) Int. Cl.
*H01L 21/033* (2006.01)
*H01L 21/3065* (2006.01)
*H01L 21/311* (2006.01)
*H01L 21/67* (2006.01)

(52) U.S. Cl.
CPC .... *H01L 21/0214* (2013.01); *H01L 21/02164* (2013.01); *H01L 21/022* (2013.01); *H01L 21/0234* (2013.01); *H01L 21/0337* (2013.01); *H01L 21/3065* (2013.01); *H01L 21/31122* (2013.01); *H01L 21/31138* (2013.01); *H01L 21/67069* (2013.01); *H01J 2237/3321* (2013.01); *H01J 2237/3341* (2013.01)

(58) Field of Classification Search
CPC ............ C23C 16/455; C23C 16/45551; C23C 16/458; C23C 16/40; C23C 16/45544; C23C 16/45536; C23C 16/4412; C23C 16/18; C23C 16/4481; H01J 37/32568; H01J 37/32623; H01J 37/3244; H01J 37/32541; H01J 37/32633; H01J 37/32733; H01J 37/32009; H01J 37/32091; H01J 37/32899; B05D 1/60; H01L 45/1616
USPC .......... 156/345.24; 118/663, 688; 427/248.1, 427/569; 216/58, 67
See application file for complete search history.

(56) References Cited

U.S. PATENT DOCUMENTS

| | | | |
|---|---|---|---|
| 2016/0225639 A1* | 8/2016 | Kihara | H01L 21/02274 |
| 2016/0379824 A1 | 12/2016 | Wise et al. | |
| 2018/0061655 A1* | 3/2018 | Tabata | H01L 21/02211 |
| 2018/0166303 A1* | 6/2018 | Tabata | H01J 37/32137 |
| 2018/0301332 A1* | 10/2018 | Kumakura | H01L 29/66795 |
| 2018/0301346 A1* | 10/2018 | Kumakura | H01L 21/02274 |
| 2018/0301347 A1* | 10/2018 | Kihara | C23C 16/045 |
| 2018/0330958 A1* | 11/2018 | Kumakura | H01L 21/67109 |
| 2019/0067009 A1* | 2/2019 | Tabata | H01L 21/6831 |
| 2019/0067019 A1* | 2/2019 | Tabata | H01L 21/0234 |
| 2019/0198350 A1* | 6/2019 | Tabata | H01L 21/02164 |
| 2019/0259626 A1* | 8/2019 | Tabata | H01J 37/32834 |
| 2019/0259627 A1* | 8/2019 | Tabata | H01J 37/321 |
| 2019/0326125 A1* | 10/2019 | Kihara | H01L 21/02211 |
| 2019/0393031 A1* | 12/2019 | Tabata | H01L 21/31138 |
| 2020/0035501 A1* | 1/2020 | Tabata | H01L 21/3083 |
| 2020/0035503 A1* | 1/2020 | Tabata | H01L 21/3065 |
| 2020/0234970 A1* | 7/2020 | Hoshi | H01L 21/31144 |
| 2021/0050219 A1* | 2/2021 | Tabata | H01L 21/31116 |
| 2022/0005700 A1* | 1/2022 | Kumakura | H01L 21/67103 |
| 2023/0010069 A1* | 1/2023 | Tabata | H01L 21/31144 |

\* cited by examiner

PLASMA PROCESSING METHOD AND PLASMA PROCESSING APPARATUS

CROSS-REFERENCE TO RELATED APPLICATIONS

This application is a continuation application of U.S. application Ser. No. 16/522,933, filed on Jul. 26, 2019, which claims priority from Japanese Patent Application No. 2018-141742 filed on Jul. 27, 2018, respectively, all of which are incorporated herein in the entirety by reference and prior is claimed to each.

TECHNICAL FIELD

The following disclosure relates to a plasma processing method and a plasma processing apparatus.

BACKGROUND

As a miniaturization of semiconductor devices is progressed, research and development of techniques that enable minute dimension processing are in progress. One of the techniques is the extreme ultraviolet lithography (EUVL).

For example, a technique for smoothing the edge of a processing target using EUVL has been proposed (U.S. Patent Laid-Open Publication No. 2016/0379824). In this technique, after forming a passivation layer that is deposited preferentially in a recess of a processing target, a protruding portion on which the passivation layer is not deposited is removed by etching. The reason why the passivation layer is deposited preferentially in the recess rather than the protrusion is that a specific surface area of the recess is larger than the protrusion. This technique is also considered to be effective in reducing the local critical dimension uniformity (LCDU).

SUMMARY

A plasma processing method according to an aspect of the present disclosure includes: providing a processing target formed with a plurality of openings having a pattern; (a) forming a first film on the processing target; (b) forming a second film on the first, the second film having an etching rate lower than that of the first film and having different film thicknesses on the side surfaces of the openings according to the sizes of the openings; and (c) etching the second film under a predetermined processing condition until a portion of the first film is removed from at least a portion of the processing target.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

<First Embodiment>

Variations in dimensions in semiconductor microfabrication affect the performance of the final products. For example, consider the case of forming a gate electrode on a semiconductor substrate. First, a polysilicon layer for a gate electrode and a mask layer for etching are sequentially formed on a semiconductor substrate. A pattern corresponding to the gate electrode is formed on the mask layer through lithography such as, for example, EUVL. Then, the polysilicon layer is etched using the mask layer to form a gate electrode. In this case, when there is a variation in the dimensions of patterns of mask layers, the variation leads to the variation in the dimensions of gate electrodes as it is. For this reason, it is desirable to increase the uniformity of pattern dimensions at the stage of the mask layer. In the first embodiment, a technique of equalizing the dimensions of patterns formed on processing targets and improve the LCDU. In the plasma processing method according to the first embodiment, for example, when a plurality of patterns having substantially the same dimensions are repeatedly formed on the processing target, the dimensions of the patterns are equalized. The plasma processing method according to the first embodiment also exhibits an improvement effect in the pattern roughness of, for example, a semiconductor wafer.

<Example of Flow of Plasma Processing of First Embodiment>

Figure 1:
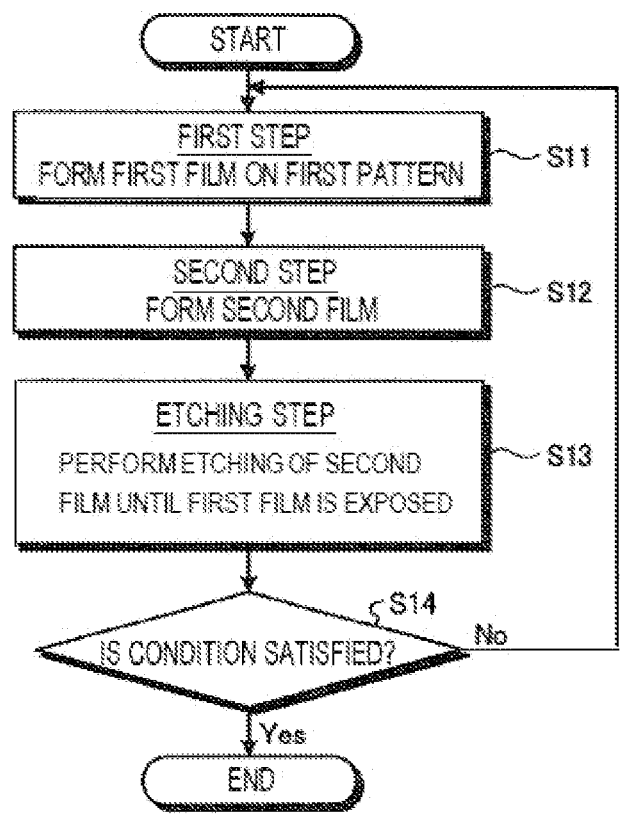
FIG. 1 is a flowchart illustrating an example of a flow of a plasma processing according to a first embodiment.

FIG. 1 is a flowchart illustrating an example of a flow of a plasma processing according to a first embodiment. The plasma processing according to the first embodiment is performed by, for example, a plasma processing apparatus described later (see, e.g., FIG. 15).

First, a processing target (e.g., a wafer) in which a plurality of openings having a predetermined pattern are formed is disposed in a space in which a plasma processing is to be performed. Then, the plasma processing apparatus executes a first step (step S11). The plasma processing apparatus forms a first film on a predetermined pattern of the processing target in the first step. Next, the plasma processing apparatus executes a second step (step S12). The plasma processing apparatus forms a second film in the second step. The second film is formed to cover the first film. Here, the deposition of the second film is performed by setting processing condition such that the amounts of the second film deposited on the side surfaces of the openings vary depending on the sizes of the openings in the processing target. In addition, the deposition of the second film is performed by setting processing condition such that the etching rate becomes lower than that of the first film. Next, the plasma processing apparatus executes an etching step (step S13). In the etching step, the plasma processing apparatus performs etching under the predetermined conditions on the processing target on which the first and second films have been sequentially formed until a portion of the first film is removed from at least a portion of the processing target from above the second film. Then, the plasma processing apparatus determines whether or not the processing target is in the state in which a predetermined condition is satisfied (step S14). When it is determined that the predetermined condition is not satisfied (No in step S14), the plasma processing apparatus returns to step S11 and repeats the processing. Meanwhile, when it is determined that the predetermined condition is satisfied (Yes in step S14), the plasma processing apparatus terminates the processing. This is an example of the flow of the plasma processing according to the first embodiment.

<LCDU Improvement Obtained Using Loading Effect and Selection Ratio>

Figure 2A:
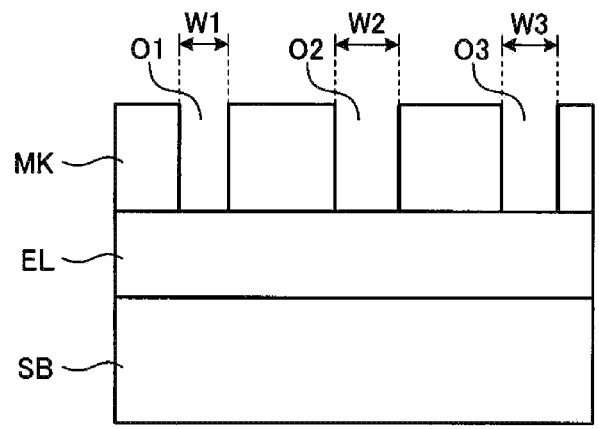
FIG. 2A is a schematic cross-sectional view of an example of a processing target of the plasma processing according to the first embodiment.
Figure 2B:
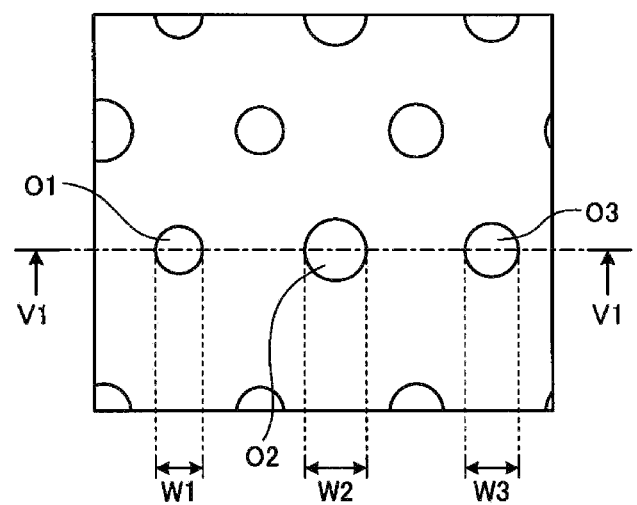
FIG. 2B is a schematic top view of the processing target illustrated in FIG. 2A.

The plasma processing according to the first embodiment will be further described with reference to FIGS. 2A to 2E. FIG. 2A is a schematic cross-sectional view of an example of a processing target of the plasma processing according to the first embodiment. FIG. 2B is a schematic top view of the processing target illustrated in FIG. 2A.

The processing target illustrated in FIG. 2A includes a substrate SB, an etching target layer EL, and a mask layer MK. The etching target layer EL and the mask layer MK are sequentially formed on the substrate SB. In addition, a predetermined pattern is formed on the mask layer MK. As illustrated in FIG. 2B, the predetermined pattern has a plurality of substantially perfect circles in a top view, and the plurality of substantially perfect circles are aligned at predetermined intervals. Three openings on a line V1-V1 in FIG. 2B are denoted by O1, O2, and O3, respectively. In addition, the widths of the openings O1, O2, and O3 aligned along the line V1-V1 are denoted by W1, W2, and W3, respectively.

Here, in design, the openings O1, O2, and O3 have the same dimension, and the widths W1, W2, and W3 have the same length. However, when the above pattern is formed on the mask layer MK through lithography such as, for example, EUVL, the dimensions of respective openings may vary. For example, as W1<W2, W2>W3, and W1<W3, a variation may occur in the width dimensions of respective openings.

Figure 2C:
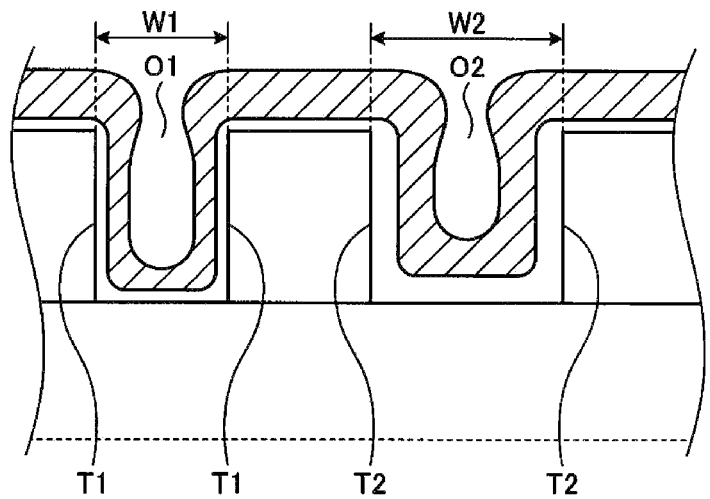
FIG. 2C is a schematic cross-sectional view illustrating the state in which a first film and a second film are formed on the processing target illustrated in FIG. 2A.

Therefore, the first step of the above embodiment is performed (FIG. 1, step S11). As an example, the first step is performed through chemical vapor deposition (CVD) using a material having a loading effect to form the first film. The loading effect means a phenomenon in which, for example, the film thickness of a film to be formed differs according to pattern density. For example, the sizes of openings after film formation vary according to a pattern size itself, for example, the opening areas of openings. In addition, the sizes of the openings after film formation vary according to the pattern shape and arrangement around the pattern. Since the film thickness varies according to the density of the pattern due to the loading effect, for example, as illustrated in FIG. 2C, the film thickness of a first film formed on the side walls T1 of a small opening O1 is thin and a second film formed on the side walls T2 of a large opening O2 is thick (see, e.g., FIG. 2C). FIG. 2C is a schematic cross-sectional view illustrating the state in which the first film and the second film are formed on the processing target illustrated in FIG. 2A. In FIG. 2C, the film thickness difference is shown more emphatically than the actual one for the sake of description.

Next, the second step of the above embodiment is performed (FIG. 1, step S12). For example, as in the first step, a second film is formed through CVD using a material having a loading effect. Then, similarly to the first film, a thin second film, which is thin on the side walls T1 and which is thick on the side walls T2, is formed (see, e.g., FIG. 2C).

Next, etching is performed on the processing target from the top on which the first film and the second film are formed (FIG. 1, step S13). First, the second film is etched away and gradually removed. At this time, the second film formed on the side walls T2 is thicker than the second film formed on the side walls T1. Therefore, even if the second film on the sidewalls T1 is removed by etching, the second film remains on the sidewall T2.

Figure 2D:
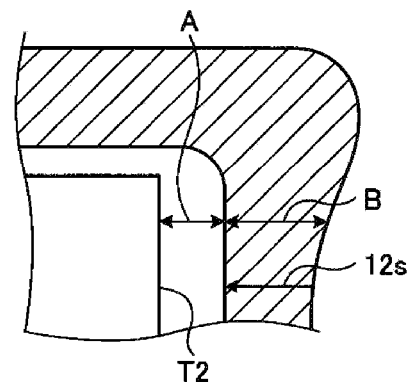
FIG. 2D is a view (1) for describing an etching removal rate of the first film and the second film deposited on the sidewall of an opening.
Figure 2E:
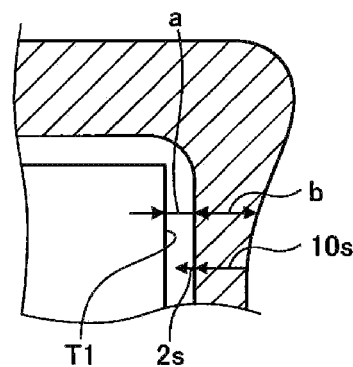
FIG. 2E is a view (2) for describing an etching removal rate of the first film and the second film deposited on the sidewall of an opening.

FIGS. 2D and 2E are views [(1) and (2)] for describing the etching removal rates of the first film and the second film deposited on the sidewalls of the openings, respectively. The first film having a film thickness A and the second film having a film thickness B are deposited on the processing target side wall T2 illustrated in FIG. 2D. In addition, on the processing target side wall T1 illustrated in FIG. 2E, a first film having a film thickness a and a second film having film thickness b are deposited. The magnitude relationship between the film thickness values is A>a and B>b.

First, it is assumed that it takes 12 seconds to remove the second film on the side wall T2 (film thickness B) by etching. In addition, it is assumed that it takes 10 seconds to remove the second film on the side wall T1 (film thickness b) by etching. Then, when etching is performed for 12 seconds on the entire processing target, the second film is removed for 12 seconds on the sidewall T2, and then the first film remains without being etched (removed film thickness is B). In contrast, on the sidewall T1, after the second film is removed for 10 seconds, the first film is further etched for 2 seconds. Therefore, the film thickness removed on the side wall T1 is equal to the film thickness b of the second film plus the film thickness α of the first film removed by the etching for 2 seconds (removed Film thickness is b+α).

Here, when the etching rate of the first film and the etching rate of the second film are approximately the same, the film thickness removed by the etching on the side wall T1 is the same as the film thickness removed by the etching on the side wall T2 (B=b+α). However, when the etching rate of the first film and the etching rate of the second film are not approximately the same, a difference occurs between the total amount of the film thickness removed by the etching on the side wall T1 and the total amount of the film thickness removed by the etching on the side wall T2 (B≠b+α).

For example, when the etching rate of the first film is higher than the etching rate of the second film, then B<b+α. In addition, while the change in the film thickness on the side wall T2 before and after the plasma processing is A+B−B=A, the change in the film thickness on the side wall T1 is a+b−(b+α)=a−α. Then, while the width W2 of the opening O2 decreases by 2 A, the width W1 of the opening O1 decreases by 2 a−2α. That is, it is possible to reduce the opening size on the wide opening O2 side by a greater amount than on the narrow opening O1 side. It is possible to further increase this effect by setting the etching rate such that the value of a increases. With this phenomenon, it is possible improve the LCDU of a processing target.

Figure 3:
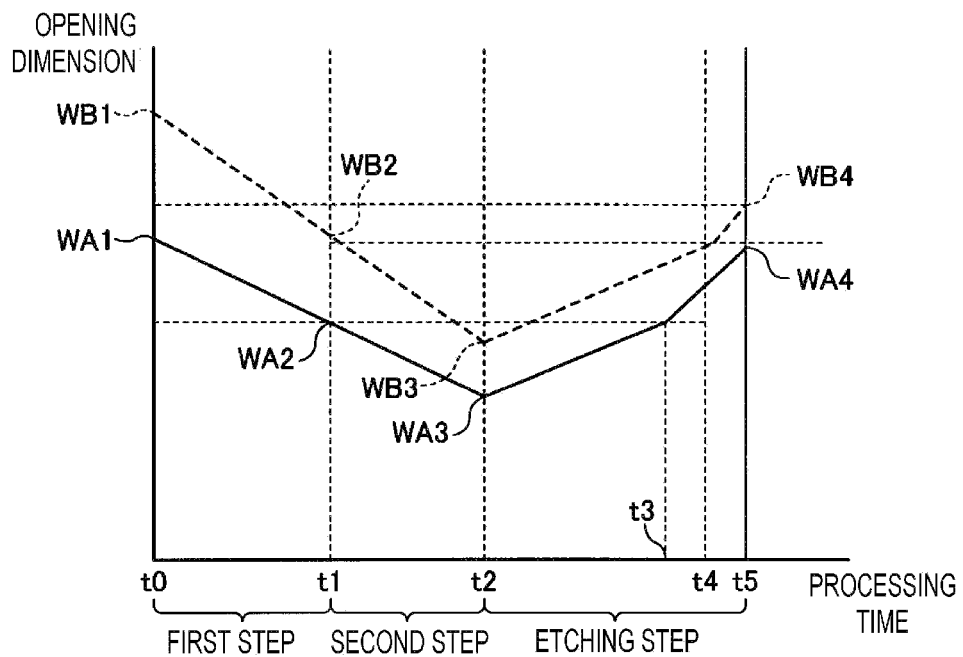
FIG. 3 is a diagram for explaining an LCDU improvement effect obtained by the plasma processing method according to the first embodiment.

FIG. 3 is a diagram for explaining an LCDU improvement effect obtained by the plasma processing method according to the first embodiment. The vertical axis in FIG. 3 represents the opening size of openings, and the horizontal axis represents a processing time. The solid line represents the change in the opening dimension between the side walls T1 of the opening O1, and the dotted line represents the change in the opening dimension between the side walls T2 of the opening O2 (see, e.g., FIG. 2C).

First, in the opening O1, when the first step is initiated at time t0, the first film starts to be deposited on the sidewalls T1. During the first step, the opening dimension gradually decreases, and at time t1 when the first step is terminated, the opening dimension decreases from WA1 before the processing to WA2. Next, when the second step is initiated at time t1, the second film starts to be deposited on the sidewalls T1 of the opening O1. During the second step, the opening dimension gradually decreases, and at time t2 when the second step is terminated, the opening dimension further to WA2.

Meanwhile, in the opening O2, when the first step is initiated at time to, the first film starts to be deposited on the sidewalls T2. During the first step, the opening dimension gradually decreases, and at time t1 when the first step is terminated, the opening dimension decreases from WB1 before the processing to WB2. Next, when the second step is initiated at time t1, the second film starts to be deposited on the sidewalls T2 of the opening O2. During the second step, the opening dimension gradually decreases, and at time t2 when the second step is terminated, the opening dimension further to WB3.

Next, when the etching step is initiated at time t2, the second film is gradually removed from the opening O1, and the opening dimension increases. At time t3, the second film deposited on the sidewalls T1 of the opening O1 is completely removed by etching to expose the first film. Since the etching rate of the first film is higher than the etching rate of the second film, the rate of increase in the opening dimension, that is, the rate of removing the film by etching increases after time t3. The opening dimension of the opening O1 at time t5 when the etching process is terminated becomes WA4.

Meanwhile, in the opening O2, when the etching step is initiated at time t2, the second film is gradually removed as in the opening O1, and thus the opening dimension increases. However, since the opening dimension WB1 of the opening O2 at the processing initiation time t0 is larger than the opening dimension WA1 of the opening O1, the thicknesses of the first and second films deposited by the loading effect is thicker in the opening O2 than in the opening O1. Therefore, all the second film is removed in the opening O2 at time t4 after time t3. After the time point t4, the etching of the first film is also initiated in the opening O2. The opening dimension of the opening O2 at time t5 when the etching processing is terminated is WB4.

As can be seen from FIG. 3, the dimensional difference between the opening O1 and the opening O2 at the processing termination time t5 (WB4−WA4) is decreasing compared with the dimensional difference between the opening O1 and the opening O2 at the processing initiation time t0 (WB1−WA1). In particular, since the etching rate increases after the removal of the second film (time t3) in the opening O1, the dimensional difference is rapidly decreasing. From this, by increasing the etching selection ratio of the first film and the second film, it is possible to quickly eliminate the dimensional difference between the openings.

<Relationship Between Loading Effect and LCDU Improvement Effect>

Next, the relationship between the loading effect and the LCDU improvement effect will be described. For example, as illustrated in FIG. 2C, it is assumed that an opening O1 and an opening O2 having an opening dimension larger than that of the opening O1 are formed in a processing target. In addition, the film thickness of the first film deposited in the first step and the film thickness of the second film deposited in the second step are a and b in the opening O1 and A and B in the opening O2, respectively. In addition, the etching selection ratio between the first film and the second film (the ratio of the etching rate of the first film to the etching rate of the second film, i.e., the etching rate of the first film/the etching rate of the second film) is assumed to be S.

At this time, when all the second film is removed in the opening O1, the film thickness of the second film remaining in the opening O2 is (B−b). Then, when all the second film remaining in the opening O2 is removed, the thickness of the first film remaining in the opening O1 is (a−(S×(B−b))). Then, the difference between the opening dimension of the opening O2 and the opening dimension of the opening O1 is reduced by (A−(a−(S×(B−b))) (=LCDU improvement amount). Here, by substituting A−a=X and B−b=Y into the above equation, the LCDU improvement amount may be expressed by Equation (1) as follows.

$$(X+(S\times Y)) \qquad \text{Equation (1)}$$

From Equation (1), it can be said that as the values of X and Y are larger, the LCDU improvement amount becomes larger. That is, for either of the first film and the second film, as the loading effect (X, Y) is larger, the LCDU improvement amount becomes larger. That is, the larger the difference in film thickness (X, Y) between the first film and the second film formed in the openings O1 and O2, the larger the improvement amount of the LCDU. Further, when there is a loading effect (X, Y) for any one of the first film and the second film, an improvement in the LCDU is expected. In addition, when the second film has a loading effect (Y) and the etching selection ratio (S) between the first film and the second film is large, a large improvement effect is expected.

<Example of Non-Using Loading Effect>

In the example of FIG. 3, the film thicknesses of the first film and the second film formed in the opening O1 and the opening O2 are controlled to be different using the loading effect. Without being limited thereto, for example, the first film may be formed by a method that does not use the loading effect, and only the second film may be formed using the loading effect. For example, the first film may be formed using atomic layer deposition (ALD).

When there is a difference between the thicknesses of the second films formed in the opening O1 and the opening O2, a deviation is caused between the etching initiation times of first films. Thus, a difference may occur in the film thickness between the films to be finally etched in the opening O1 and the opening O2. For this reason, even if the first film is formed without using the loading effect, it is possible to enjoy the effects of the present embodiment.

<Etching Rate and Processing Condition>

Figure 4:
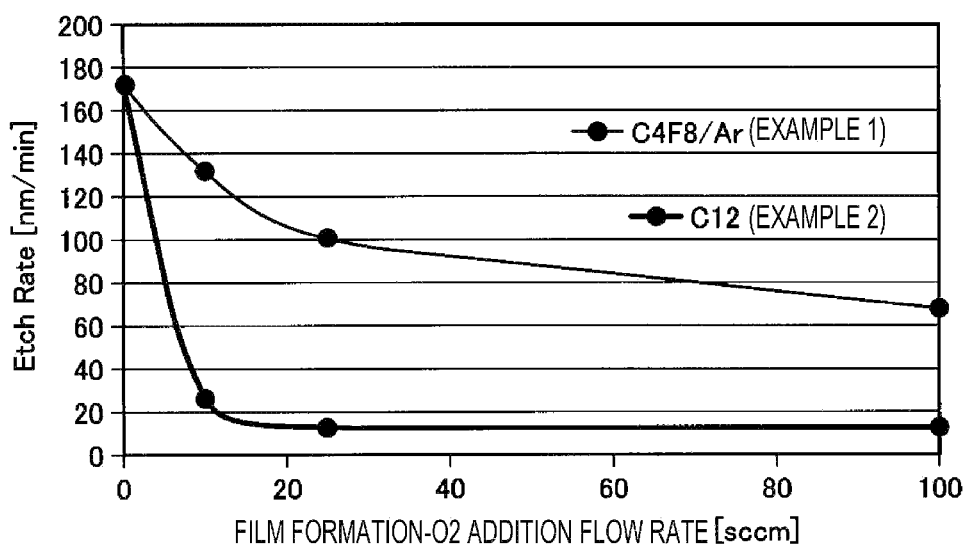
FIG. 4 is a diagram for explaining a relationship between film forming conditions and etching resistance.

FIG. 4 is a diagram for explaining a relationship between film forming conditions and etching resistance. The example illustrated in FIG. 4 represents that it is possible to obtain the selection ratio even if the first film and the second film are formed of the same material. The vertical axis in FIG. 4 represents an etching rate (nm/min), and the horizontal axis represents an $O_2$ addition flow rate (sccm) at the time of film formation.

The film forming conditions used in the example of FIG. 4 are as follows. In addition, among the following conditions, the applied powers are indicated in the order of the applied power for generating plasma and the applied power for generating bias voltage.

The pressure in the chamber: 10 mT
Applied power: 1000 W+0 W
Gas type and flow rate: $SiCl_4/He/O_2$=25/100/@@sccm
Processing time: 60 seconds
The etching conditions used in the examples of FIG. 4 are as follows.
Example 1
The pressure in the chamber 20 mT
Applied power: 500 W+100 W
Gas type and flow rate: $C_4F_8/Ar$=40/200 sccm
Example 2
The pressure in the chamber 20 mT
Applied power: 500 W+50 W As can be seen from the examples of FIG. 4, even in the case of forming the same $SiO_2$ film, it is possible to change the etching rate by changing the addition flow rate of $O_2$. In the examples of FIG. 4, the etching rate is higher as the $O_2$ addition flow rate is smaller, and the etching rate is lower as the $O_2$ addition flow rate is higher. Therefore, after the $SiO_2$ film is formed as a first film by setting the $O_2$ addition flow rate low, it is possible to form the $SiO_2$ film as a second film by setting the $O_2$ addition flow rate high. Although the etching selection ratio varies according to the types of etching gases, in the examples of FIG. 4, it is possible to control the etching selection ratio within the range of about 1 to 17 for the same $SiO_2$ film.

<Processing Sequence Example 1>

Figure 5:
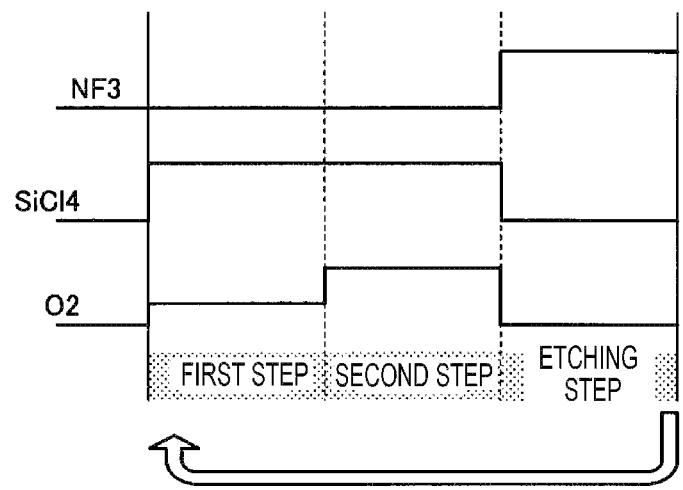
FIG. 5 is a view illustrating an example of the processing sequence of the plasma processing according to the first embodiment.

FIG. 5 is a view illustrating an example of the processing sequence of the plasma processing according to the first embodiment. In the first step, a $SiO_2$ film is deposited as a first film by CVD using $SiCl_4$ and $O_2$ as processing gases. In the second step as well, a $SiO_2$ film is deposited as a second film by CVD using $SiCl_4$ and $O_2$ as processing gases. However, in the second step, the etching rate of the first film is adjusted to be higher than the etching rate of the second film by increasing the flow rate of $O_2$ compared to that in the first step. The etching step is performed using $NF_3$. Thus, in the plasma processing method according to the first embodiment, it is possible to form the same type of films as a first film and a second film by changing the processing condition in the first step and the second step.

<Processing Sequence Example 2>

Figure 6:
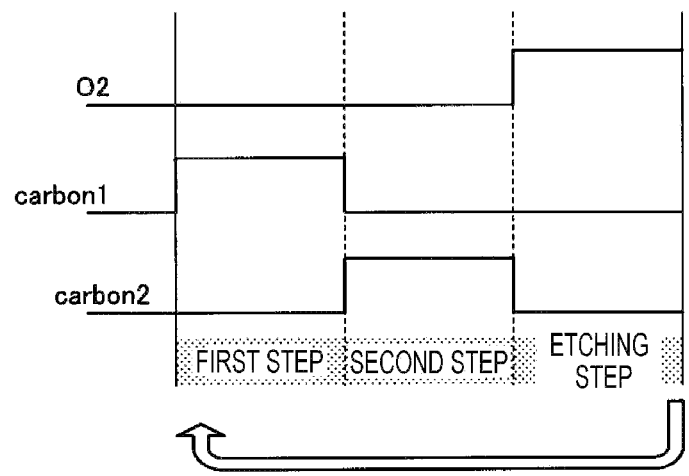
FIG. 6 is a view illustrating another example of a processing sequence of a plasma processing according to the first embodiment.

FIG. 6 is a view illustrating another example of a processing sequence of a plasma processing according to the first embodiment. In the first step, a first carbon film is deposited as a first film by CVD using a first type of carbon-containing gas as a processing gas. The first type of carbon-containing gas is, for example, a CF-based gas. The first type of carbon-containing gas is, for example, $C_4F_8$ or $C_4F_6$. In addition, the first type of carbon-containing gas is, for example, a CHF-based gas. The first type of carbon-containing gas is, for example, $CH_2F_2$ or $CH_3F$. In the second step, a second carbon film is deposited as a second film by CVD using a second type of carbon-containing gas as a processing gas. The second type of carbon-containing gas is, for example, a CH-based gas such as, for example, $CH_4$. The etching step is performed using $O_2$. A rare gas such as, for example, Ar may be used in the first step, the second step, and the etching step.

<Processing Sequence Example 3>

Figure 7:
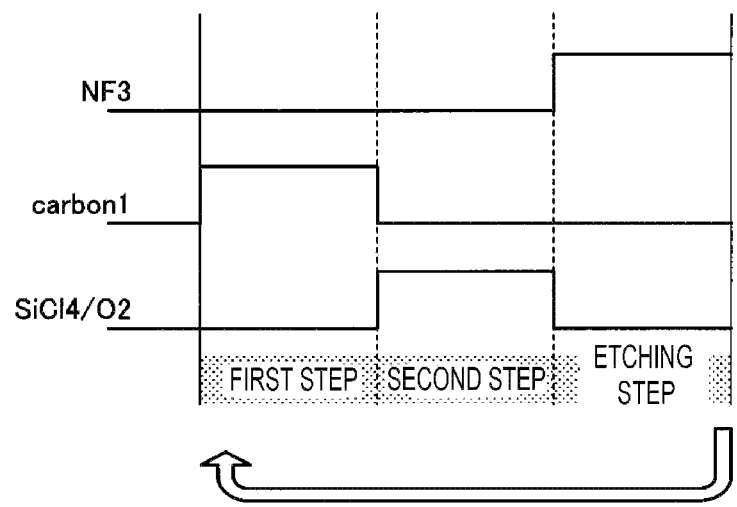
FIG. 7 is a view illustrating still another example of a processing sequence of a plasma processing according to the first embodiment.

FIG. 7 is a view illustrating still another example of a processing sequence of a plasma processing according to the first embodiment. In the first step, a carbon film is deposited as a first film by CVD using a carbon-containing gas as a processing gas. For example, a CF-based gas, a CH-based gas, or a CHF-based gas may be used as a processing gas. In the first step, a $SiO_2$ film is deposited as a second film by CVD using $SiCl_4$ and $O_2$ as processing gases. The etching step is performed using $NF_3$.

As described above, the plasma processing method according to the first embodiment may be executed by combining various gas types. In addition, the film types of the first film and the second film may be the same.

<Number of Cycles>

In the plasma processing method according to the first embodiment, the first step, the second step, and the etching step are performed as one cycle, and a plurality of cycles are performed until a predetermined condition is satisfied. The predetermined condition is, for example, that a dimensional difference between the plurality of openings formed in a processing target has become equal to or less than a predetermined value, or that a predetermined number of cycles have been executed.

<Film Type, Gas Type, Etc.>

In the first embodiment, the film types of the first film and the second film have been described as, for example, $SiO_2$, or a carbon-containing film (e.g., CF-based film, a CH-based film, or a CHF-based film). However, without being limited thereto, the first film and the second film may be, for example, silicon-containing films such as, for example, a silicon oxide ($SiO_x$) film, a silicon nitride (SiN) film, a silicon carbide (SiC) film, and a silicon (Si) film. In addition, the first film and the second film may be, for example, a titanium (Ti)-containing film or a tungsten (W)-containing film. In addition, the first film and the second film may be, for example, boron-containing films.

As the gas type used in the etching step, when the film to be etched contains silicon or metal, a halogen-containing gas is suitable. When the film to be etched is a carbon-containing film, an oxygen-containing gas may be used as the etching gas.

<Etching Method>

In addition, in order to etch the sidewalls in the etching step, for example, isotropic and anisotropic etching, plasma etching, or atomic layer etching (ALE) may be used. In addition, in the etching step, the processing condition for etching may be changed when the second film is removed and at least a portion of the first film is exposed. For example, the removal rate of the first film by etching may be further increased by changing the processing condition of etching from the first processing condition suitable for etching the second film to the second processing condition suitable for etching the first film. For example, at the time when at least a portion of the first film is exposed, the etching gas type may be changed to accelerate the etching rate of the first film.

In addition, by modifying the first embodiment, etching may be performed after depositing a film, of which the etching rate is lower than that of the mask layer MK (see FIG. 2A), on the mask layer MK using the mask layer MK itself as the first film. Then, the LCDU may be improved by varying the etching amount of the mask layer MK different according to the position. Further, instead of the two layers of the first film and the second film, a film of two or more layers may be formed. In that case, a difference in etching rate may be provided between the films. In this case as well, the etching rate is also set such that the etching rate becomes lower for a film on the outer side.

In the first embodiment, the pattern in which a plurality of perfect circles illustrated in FIGS. 2A and 2B are aligned has been described as an example. However, the present embodiment is not limited to the pattern of the shape illustrated in FIGS. 2A and 2B, and may be applied to improve the variation in the LCDU or the line shape of an elliptical pattern. For example, the present embodiment may be applied an improvement in line edge roughness (LER) and line width roughness (LWR).

<Effect of First Embodiment>

The plasma processing method according the first embodiment includes a first step, a second step, and an etching step. In the first step, the plasma processing apparatus forms a first film on a processing target in which a plurality of openings having a predetermined pattern are formed. In the second step, the plasma processing apparatus forms a second film having a lower etching rate than the first film on the processing target on which the first film is formed, in which the film thicknesses on the side surfaces of the openings are different according to the sizes of the openings. In the etching step, the plasma processing apparatus performs etching under a predetermined processing condition until a portion of the first film is removed from at least a portion of the processing target from above the second film. Therefore, according to the plasma processing method of the first embodiment, it is possible to improve LCDU using a loading effect and a difference between the etching rates of the first film and the second film. The plasma processing method according to the first embodiment may be applied to the improvement of the LCDU of a pattern manufactured using extreme ultraviolet lithography (EUVL).

In addition, in the plasma processing method according to the first embodiment, the predetermined processing condition in the plasma processing apparatus is changed from the first processing condition to the second processing condition at the time when the first film is exposed in at least a portion of the processing target in the etching step. For example, in the plasma processing apparatus, the removal rate of the first film by etching may be further increased by changing the processing condition of etching from the first processing condition suitable for etching the second film to the second processing condition suitable for etching the first film. Therefore, with the plasma processing apparatus, it is possible to further improve the improvement effect of the LCDU.

Further, in the plasma processing method according to the first embodiment, the first step, the second step, and the etching step are repeatedly executed in the plasma processing apparatus until it is determined that the predetermined condition is satisfied. Thus, the plasma processing apparatus is capable of executing the processing until the desired LCDU is achieved.

<Modification 1—Formation of Gradient Composition Film>

In the first embodiment, the LCDU is improved by forming each of the first film and the second film and then performing etching. In Modification 1, the film deposition condition is changed while forming a single layer film, thereby achieving the same effect as forming the two films of the first film and the second film in the first embodiment.

Figure 8:
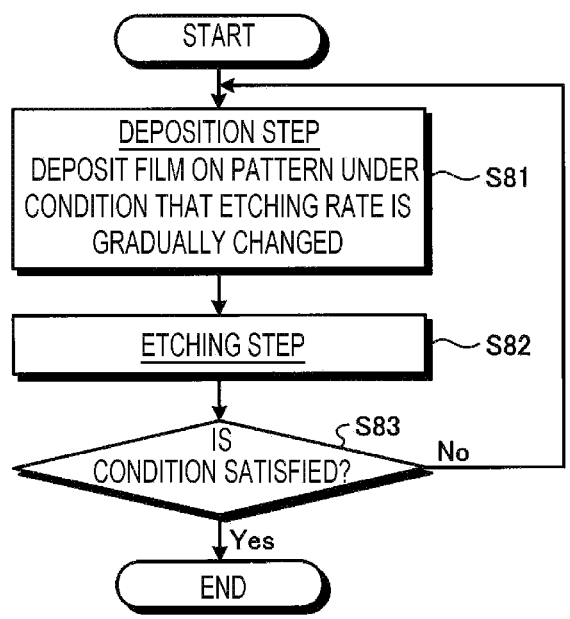
FIG. 8 is a flowchart illustrating an example of a flow of a plasma processing according to Modification 1.

FIG. 8 is a flowchart illustrating an example of a flow of a plasma processing according to Modification 1. The plasma processing according to Modification 1 is performed in, for example, a plasma processing apparatus described later (see, e.g., FIG. 15).

First, like the plasma processing according to the first embodiment (see, e.g., FIG. 1), a processing target (e.g., a wafer) in which a plurality of openings having a predetermined pattern are formed is disposed in a space in which a plasma processing is to be performed. The plasma processing apparatus executes a deposition process (step S81). In the deposition step, the plasma processing apparatus deposits a film on the pattern under a processing condition that the etching rate of the deposited film gradually decreases as the distance from the processing target increases. In addition, the film thickness of a film deposited in the deposition step varies according to the sizes of the openings due to a loading effect. Next, the plasma processing apparatus executes an etching step (step S82). Then, the plasma processing apparatus determines whether or not the processing target is in the state in which a predetermined condition is satisfied (step S83). When it is determined that the predetermined condition is not satisfied (No in step S83), the plasma processing apparatus returns to step S81 and repeats the processing. Meanwhile, when it is determined that the predetermined condition is satisfied (Yes in step S81), the plasma processing apparatus terminates the processing. This is an example of the flow of the plasma processing according to Modification 1.

<Processing Sequence Example 1>

Figure 9:
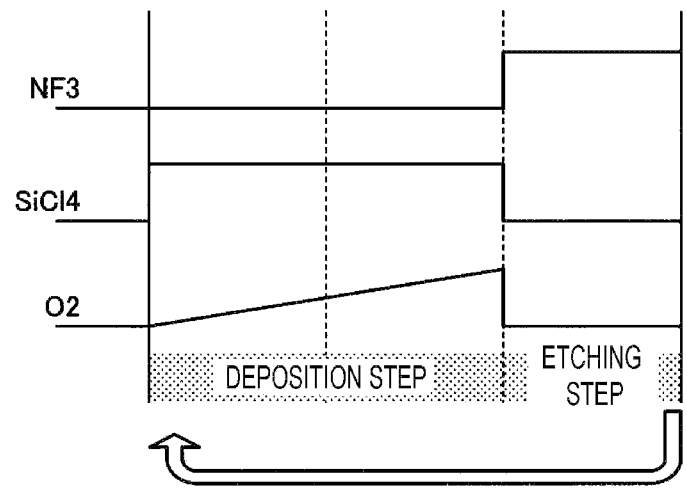
FIG. 9 is a view illustrating an example of the processing sequence of the plasma processing according to Modification 1.

FIG. 9 is a view illustrating an example of the processing sequence of the plasma processing according to Modification 1. In the example of FIG. 9, a $SiO_2$ film is deposited as in the example of FIG. 5. First, in the deposition step, the $SiO_2$ film is deposited by CVD using, for example, $SiCl_4$ and $O_2$ as processing gases. During the deposition step, the flow rate of $O_2$ is gradually increased. For this reason, in the sequence of FIG. 9, the etching rate of the $SiO_2$ film formed on the processing target is gradually decreased (see, e.g., FIG. 4). During the deposition step, the flow rate of $SiCl_4$ is constant. After the deposition step, an etching step is performed by generating plasma from $NF_3$ gas. As described above, in the plasma processing method according to Modification 1, the etching rate of one film is capable of being gradually changed by changing the processing condition during the deposition step. For example, in the plasma processing method, by gradually changing the ratio of a plurality of gases which are components of the film, it is possible to deposit the film while continuously changing the etching rate. In the plasma processing method, it is possible to gradually change the etching rate of one film by increasing the flow rate of a predetermined gas.

<Processing Sequence Example 2>

Figure 10:
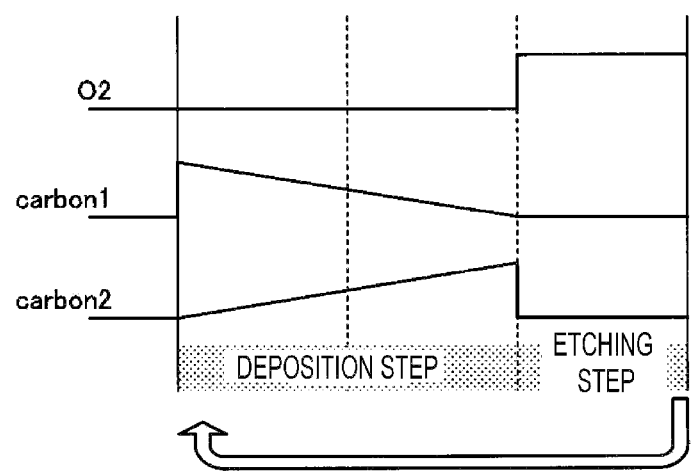
FIG. 10 is a view illustrating another example of the processing sequence of the plasma processing according to Modification 1.

FIG. 10 is a view illustrating another example of the processing sequence of the plasma processing according to Modification 1. In the example of FIG. 10, a film is deposited using two types of carbon-containing gases as in the example of FIG. 6. However, unlike the example of FIG. 6, in the example of FIG. 10, during the deposition step, the flow rate of the second carbon-containing gas is gradually increased simultaneously with gradually decreasing the flow rate of the first carbon-containing gas. For this reason, the film to be deposited has a strong nature of the first carbon-containing gas at the initiation of the processing, and gradually becomes a film having a strong property of the second carbon-containing gas. For example, as illustrated in FIG. 6, when the etching rate of the first carbon film is higher than the etching rate of the second carbon film, carbon films, of which the etching rates are gradually lowered from the lower layer toward the upper layer, may be deposited by the processing illustrated in FIG. 10. In addition, the first carbon-containing gas is, for example, a CF-based gas (e.g., $C_4F_8$ or $C_4F_6$) or a CHF-based gas ($CH2F2$ or $CH_3F$). The second carbon-containing gas is, for example, a CH-based gas (e.g., $CH_4$).

<Processing Sequence Example 3>

Figure 11:
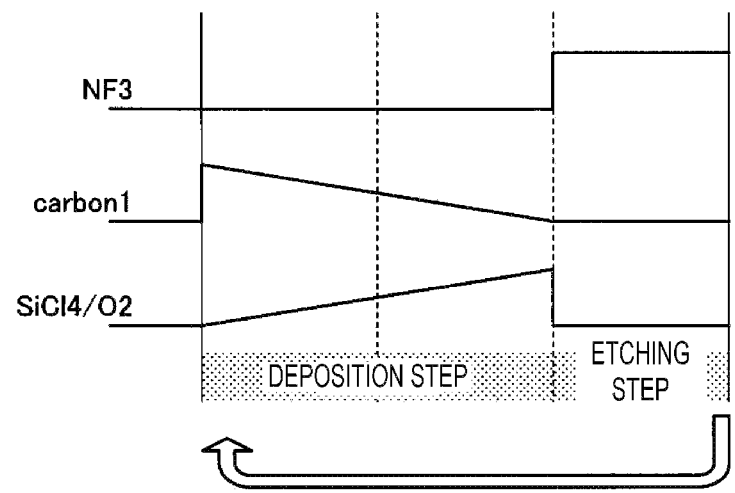
FIG. 11 is a view illustrating still another example of the processing sequence of the plasma processing according to Modification 1.

FIG. 11 is a view illustrating still another example of the processing sequence of the plasma processing according to Modification 1. In the example of FIG. 11, the film is deposited using the same processing gas as the example of FIG. 7. However, unlike the example of FIG. 7, in the example of FIG. 11, during the deposition step, the flow rates of $SiCl_4$ and $O_2$ are gradually increased simultaneously with gradually decreasing the carbon-containing gas. For this reason, the film to be deposited is a carbon film at the initiation of the processing, and the composition gradually changes to a $SiO_2$ film. For this reason, by the processing of FIG. 11, it is possible to deposit films, of which etching rates are gradually lowered from the lower layer toward the upper layer.

As in the first embodiment, each sequence of Modification 1 may be repeatedly executed for an arbitrary number of cycles until a desired LCDU is achieved.

Effect of Modification 1

The plasma processing method according to Modification 1 includes a deposition step and an etching step. In the deposition step, the plasma processing apparatus deposits a film on a processing target in which a plurality of openings having a predetermined patter are formed under the condition that the etching rate decreases as the distance from the processing target increases and the deposited amount on the side surfaces of the openings varies according to the sizes of the openings. In the etching step, the plasma processing apparatus performs etching of a processing target on which a film is deposited. For this reason, according to the plasma processing method of Modification 1, it is possible to provide a difference in etching rate by depositing one film while changing the processing conditions. For this reason, according to the plasma processing method of Modification 1, it is possible to improve the LCDU with a small number of steps.

In addition, according to the plasma processing method of Modification 1, in the deposition step, the plasma processing apparatus deposits a film of which the etching rate changes continuously by gradually changing the ratio of a plurality of supplied gases. For example, the plasma processing apparatus gradually increases the oxygen content of the supplied gases. For this reason, according to Modification 1, the plasma processing apparatus is able to improve the LCDU by a simple processing.

In the plasma processing method according to Modification 1, the deposition step and the etching step are repeatedly performed until it is determined that a predetermined condition is satisfied. For this reason, according to Modification 1, it is possible to improve the LCDU to a desired level.

<Modification 2—Adjustment of Etching Rate by Modification>

In Modification 1, the etching rate is changed in one film by changing the flow rate of components in forming a film. In Modification 2, by performing a modification processing on the formed film to turn the film into form the first film, a difference is made between the first film and the second film.

Figure 12:
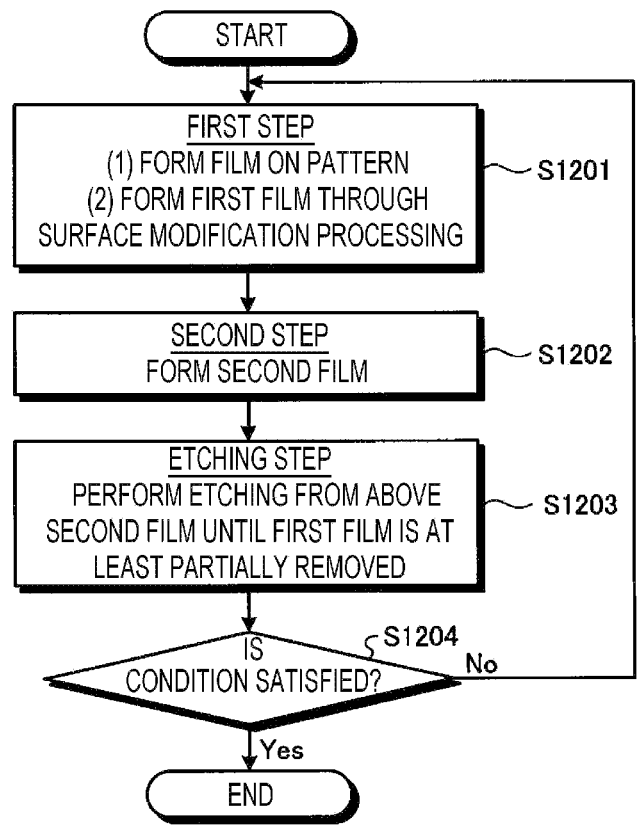
FIG. 12 is a flowchart illustrating an example of a flow of a plasma processing according to Modification 2.

FIG. 12 is a flowchart illustrating an example of a flow of the plasma processing according to Modification 2. The plasma processing according to Modification 2 is performed in, for example, a plasma processing apparatus described later (see, e.g., FIG. 15).

First, like the plasma processing according to the first embodiment (see, e.g., FIG. 1), a processing target (e.g., a wafer) in which a plurality of openings having a predetermined pattern are formed is disposed in a space in which a plasma processing is to be performed. The plasma processing apparatus executes a first step (step S1201). First, the plasma processing apparatus deposits a film on the pattern in the first step. Next, the plasma processing apparatus performs a modification processing on the deposited film. The modification processing is a processing to increase the etching rate of the film by modifying the film surface so as to be brittle. This forms the first film. Next, the plasma processing apparatus executes a second step (step S1202). In the second step, the plasma processing apparatus deposits a second film on the first film by, for example, CVD. The second step is performed under the condition that a loading effect is obtained, as in the first embodiment. Next, the plasma processing apparatus executes an etching step (step S1203). Then, the plasma processing apparatus determines whether or not the processing target is in the state in which a predetermined condition is satisfied (step S1204). When it is determined that the predetermined condition is not satisfied (No in step S1204), the plasma processing apparatus returns to step S1201 and repeats the processing. Meanwhile, when it is determined that the predetermined condition is satisfied (Yes in step S1204), the plasma processing apparatus terminates the processing. This is an example of the flow of the plasma processing according to Modification 2.

The modification processing is, for example, a processing of generating plasma in the state in which a gas that is a raw material of the film is not supplied. For example, in the first step, a nitride film (SiN) is deposited first. Thereafter, the plasma of hydrogen ($H_2$) is generated, and the nitride film is exposed to the H plasma. Since this processing makes the film surface brittle, the etching rate becomes high. However, the combination of the gas type when generating the plasma and the film type is not limited to this. For example, after depositing the oxide film ($SiO_2$) in the first step, the modification processing may be performed by generating the plasma of hydrogen ($H_2$) and exposing the oxide film to the H plasma.

In addition, the modification processing may be performed using the loading effect or may be performed without using the loading effect. In the case of using the loading effect, the larger the opening dimension, the greater the degree of modification or the depth from the surface to be modified. In the case of modifying the nitride film with the H plasma, the degree of exposure to plasma becomes higher in a portion having a larger surface area. Thus, it is possible to increase the degree of modification or the modification depth as the opening dimension becomes larger.

The plasma processing method according Modification 2 includes a first step, a second step, and an etching step. In the first step, the plasma processing apparatus forms a first film on a processing target in which a plurality of openings having a predetermined pattern are formed. In the second step, the plasma processing apparatus forms a second film having a lower etching rate than the first film on the processing target on which the first film is formed, in which the film thicknesses on the side surfaces of the openings are different according to the sizes of the openings. In the etching step, the plasma processing apparatus performs etching under a predetermined processing condition until a portion of the first film is removed from at least a portion of the processing target from above the second film. Then, in Modification 2, in the first step, the plasma processing apparatus forms the first film having a higher etching rate than the second film by performing the modification processing on the film deposited on the processing target. The modification processing is, for example, a processing of exposing a film to plasma under a predetermined process condition. Therefore, according to Modification 2, it is possible to make a difference in etching rate while depositing the same type of film as the first and second films.

<Modification 3—Formation of Second Film by Modification Processing>

In Modification 2, a difference is made between the etching rates of the first film and the second film by performing the modification processing. In Modification 3, the film to be deposited is a single layer, and the modification processing is performed after the deposition of the film, thereby obtaining the same effect as depositing two films having different etching rates.

Figure 13:
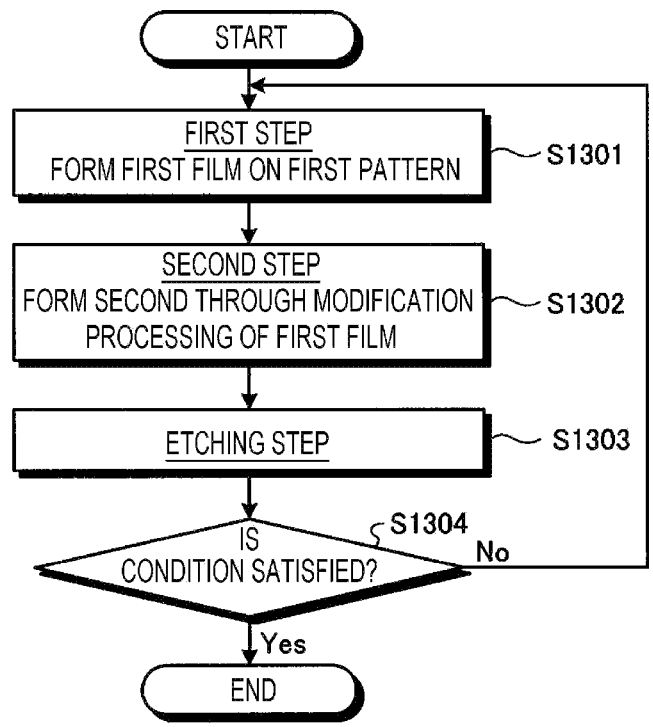
FIG. 13 is a flowchart illustrating an example of a flow of a plasma processing according to Modification 3.

FIG. 13 is a flowchart illustrating an example of a flow of a plasma processing according to Modification 3. The plasma processing according to Modification 3 is performed in a plasma processing apparatus described later (see, e.g., FIG. 15).

First, like the plasma processing according to the first embodiment (see, e.g., FIG. 1), a processing target (e.g., a wafer) in which a plurality of openings having a predetermined pattern are formed is disposed in a space in which a plasma processing is to be performed. The plasma processing apparatus executes a first step (step S1301). First, the plasma processing apparatus deposits a film on the pattern in the first step. The type of film deposited here is not particularly limited. However, the film to be deposited is formed by executing CVD using, for example, the same type of gas without changing a processing condition during the processing. Next, the plasma processing apparatus executes a second step (step S1302). In the second step, the plasma processing apparatus performs a modification processing on the film formed in the first step. The modification processing is a processing for lowering the etching rate of the surface of the film formed in the first step. In addition, the modification processing is performed under the condition that a loading effect is exhibited. That is, the modification processing is carried out under the condition that the degree of modification or the depth from the surface to be modified increases as the opening dimension increases. Next, the plasma processing apparatus executes an etching step (step S1303). Then, the plasma processing apparatus determines whether or not the processing target is in the state in which a predetermined condition is satisfied (step S1304). When it is determined that the predetermined condition is not satisfied (No in step S1304), the plasma processing apparatus returns to step S1301 and repeats the processing. Meanwhile, when it is determined that the predetermined condition is satisfied (Yes in step S1304), the plasma processing apparatus terminates the processing. This is an example of the flow of the plasma processing according to Modification 3.

Figure 14:
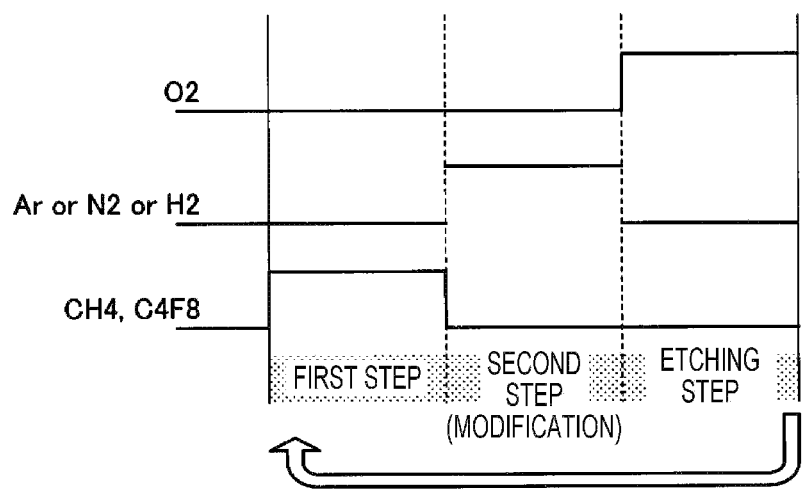
FIG. 14 is a view illustrating an example of the processing sequence of the plasma processing according to Modification 3.

FIG. 14 is a view illustrating an example of the processing sequence of the plasma processing according to Modification 3. In the example of FIG. 14, after the first step (CVD), the plasma processing apparatus performs a modification step as a second step. Thereafter, the plasma processing apparatus performs an etching processing. In the first step in the example of FIG. 14, the plasma processing apparatus deposits a film using methane ($CH_4$) and octafluorocyclobutane ($C_4F_8$) as processing gases. In the next second step, the plasma processing apparatus stops supply of $CH_4$ and $C_4F_8$ and supplies a rare gas such as, for example, argon (Ar) or helium (He), nitrogen ($N_2$), or hydrogen ($H_2$) so as to generate plasma. The film deposited in the first step is compacted and increased in density by being exposed to the plasma. Therefore, the film is hardened in the second step, and thus the etching rate is lowered. At this time, since the degree of exposure of the film deposited in the first step is greater in a portion having a larger opening dimension, the degree of modification or the depth to be modified varies according to the opening dimension. For this reason, it is possible to obtain a loading effect, which is substantially the same as, for example, the first embodiment in which the second film is deposited using the loading effect. After the second step, the plasma processing apparatus supplies $O_2$ to perform etching of the modified film.

The gas types that can be used in the processing illustrated in FIG. 14 are not limited to $C_4F_8$ and $CH_4$. In the first step, for example, a film may be deposited using a type of gas containing silicon or carbon. Then, in the second step, supply of the type of gas containing silicon or carbon is stopped, and then, for example, a rare gas (e.g., Ar), hydrogen gas ($H_2$), or nitrogen gas ($N_2$) is supplied to generate plasma. The CVD executed in the first step may be plasma CVD.

<Effect of Modification 3>

In the plasma processing method according to Modification 3, in the second step, a modification processing is performed on the first film so as to modify the first film, thereby forming the second film. In addition, the modification processing exposes the first film to the plasma under a processing condition that the depth from the surface to be modified by the plasma or the degree of modification becomes greater in an opening having a larger size. For this reason, according to the plasma processing method of Modification 3, it is possible to change the etching rate of a film by changing the property of the film using the loading effect.

Therefore, according to Modification 3, it is possible to obtain the same effect as, for example, the first embodiment or the like in which two films are used, using one film.

In the plasma processing method according to Modification 3, the deposition step and the etching step are repeatedly performed until it is determined that a predetermined condition is satisfied. Therefore, according to the plasma processing method of Modification 3, it is possible to obtain a desired LCDU improvement effect by adjusting the number of repetitions of deposition and etching steps.

<Example of Plasma Processing Apparatus According to Embodiment>

The plasma processing methods according to the first embodiment, and Modifications 1 to 3 may be performed using the plasma processing apparatus 1 described below.

Figure 15:
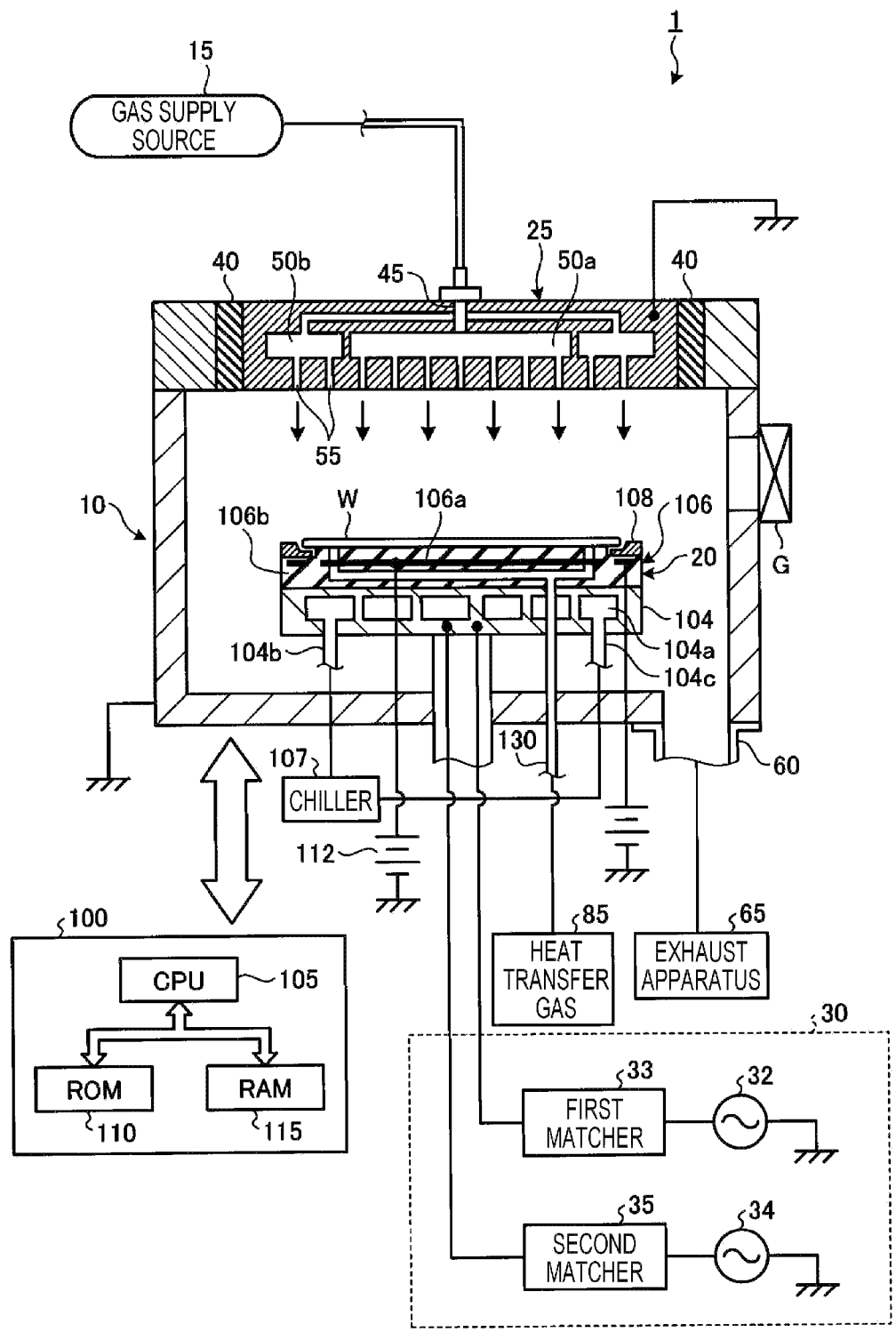
FIG. 15 is a view illustrating an example of a vertical cross section of a plasma processing apparatus according to an embodiment.

Next, a substrate processing apparatus 1 according to an embodiment will be described with reference to FIG. 15. FIG. 15 is a view illustrating an example of a vertical cross section of a plasma processing apparatus 1 according to an embodiment. In the plasma etching apparatus 1 according to the present embodiment, a desired plasma processing such as, for example, plasma etching, film formation, or sputtering, is performed on a semiconductor wafer. The plasma processing apparatus 1 according to the present embodiment is a parallel flat plate type plasma processing apparatus (capacitively coupled plasma processing apparatus) in which a stage 20 and a gas shower head 25 are disposed inside a chamber 10 to face each other. The stage 20 also functions as a lower electrode, and the gas shower head 25 also functions as an upper electrode.

The plasma etching apparatus 1 has a cylindrical chamber 10 made of, for example, aluminum, of which the surface is subjected to an alumite treatment (anodized). The chamber 10 is electrically grounded. The stage 20 configured to place a semiconductor wafer (hereinafter simply referred to as a "wafer W") thereon is provided on the bottom of the chamber 10. The wafer W is an example of a processing target. The stage 20 includes an electrostatic chuck 106 configured to hold a wafer W by an electrostatic attraction force and a base 104 configured to support the electrostatic chuck 106. The base 104 is formed of, for example, aluminum (Al), titanium (Ti), or silicon carbide (SiC).

The electrostatic chuck 106 is provided on the upper surface of the base 104 in order to electrostatically attract a wafer. The electrostatic chuck 106 has a structure in which a chuck electrode 106a is sandwiched between insulators 106b. A DC voltage source 112 is connected to the chuck electrode 106a, and a DC voltage HV is applied from the DC voltage source 112 to the chuck electrode 106a, whereby the wafer W is attracted to the electrostatic chuck 106 by an electrostatic force. On the upper surface of the electrostatic chuck 106, a holding surface configured to hold the wafer W thereon and a peripheral edge portion which is lower than the holding surface are formed. The wafer W is placed on the holding surface of the electrostatic chuck 106. Hereinafter, the holding surface of the electrostatic chuck 106 will be appropriately referred to as a "placement surface of the stage 20."

A focus ring 108 is disposed on the peripheral edge portion of the electrostatic chuck 106 so as to surround the wafer W placed on the placement surface of the stage 20. The focus ring 108 is formed of, for example, silicon or quartz. The focus ring 108 functions to enhance in-plane uniformity of etching.

In addition, inside the stage 20 (the base 104), a coolant flow path 104a is formed. A coolant inlet pipe 104b and a coolant outlet pipe 104c are connected to the coolant flow path 104a. A cooling medium (hereinafter, also referred to as "coolant") such as, for example, cooling water or brine output from a chiller 107 circulates through the coolant inlet pipe 104b, the coolant flow path 104a, and the coolant outlet pipe 104c. The stage 20 and the electrostatic chuck 106 are cooled by the coolant.

A heat transfer gas supply source 85 supplies a heat transfer gas such as, for example, helium gas (He) or argon gas (Ar) through a gas supply line 130 to the rear surface of the wafer W on the electrostatic chuck 106. With such a configuration, the temperature of the electrostatic chuck 106 is controlled by the coolant circulated in the coolant flow path 104a and the heat transfer gas supplied to the rear surface of the wafer W.

The stage 20 is connected with a power supply apparatus 30 configured to supply two-frequency superimposed power. The power supply device 30 may include a first radio-frequency power supply 32 configured to supply first radio-frequency power of a first frequency (radio-frequency power for plasma generation), a second radio-frequency power supply 34 configured to supply second radio-frequency power of a second frequency lower than the first frequency (radio-frequency power for bias voltage generation). The first radio-frequency power supply 32 is electrically connected to the stage 20 via a first matcher 33. The second radio-frequency power supply 34 is electrically connected to the stage 20 via a second matcher 35. The first radio-frequency power supply 32 applies, for example, first radio-frequency power of 40 MHz to the stage 20. The second radio-frequency power supply 34 applies, for example, second radio-frequency power of 400 kHz to the stage 20. In the present embodiment, the first radio-frequency power is applied to the stage 20. However, the first radio-frequency power may be applied to the gas shower head 25.

The first matcher 33 matches a load impedance to the internal (or output) impedance of the first radio-frequency power supply 32. The second matcher 35 matches a load impedance to the internal (or output) impedance of the second radio-frequency power supply 34. The first matcher 33 functions such that the internal impedance of the first radio-frequency power supply 32 apparently coincides with the load impedance when plasma is generated in the chamber 10. The second matcher 35 functions such that the internal impedance of the second radio-frequency power supply 34 apparently coincides with the load impedance when plasma is generated in the chamber 10.

The gas shower head 25 is attached so as to close the opening of the ceiling portion of the chamber 10 via a shield ring 40 that covers the peripheral edge portion of the gas shower head 25. The gas shower head 25 may be electrically grounded as illustrated in FIG. 15. In addition, a variable DC power supply may be connected to apply a predetermined DC voltage to the gas shower head 25.

A gas introduction port 45 for introducing a gas is formed in the gas shower head 25. Inside the gas shower head 25, a center diffusion chamber 50a and an edge diffusion chamber 50b are branched from the gas introduction port 45. The gas output from the gas supply source 15 is supplied to the diffusion chambers 50a and 50b via the gas introduction port 45, diffused in the diffusion chambers 50a and 50b, and introduced from a large number of gas supply holes 55 toward the stage 20.

An exhaust port 60 is formed in the bottom of the chamber 10, and the inside of the chamber 10 is evacuated by an exhaust apparatus 65 connected to the exhaust port 60. This makes it possible to maintain the inside of the chamber 10 at a predetermined degree of vacuum. On the side wall of the chamber 10, a gate valve G is provided. The gate valve G opens/closes a loading/unloading port when a wafer W is loaded/unloaded W into/from the chamber 10.

The plasma processing apparatus 1 is provided with a controller 100 configured to control the overall operation of the apparatus. The controller 100 includes a central processing unit (CPU) 105, a read only memory (ROM) 110, and a random-access memory (RAM) 115. According to various recipes stored in these storage areas, the CPU 105 executes a desired processing such as, for example, a plasma processing to be described later. The recipes include, for example, process time, pressure (gas evacuation), radio-frequency power and voltage, various gas flow rates, temperature in the chamber (upper electrode temperature, side wall temperature of the chamber, or wafer W temperature (electrostatic chuck temperature)), and the temperature of coolant output from the chiller 107. In addition, recipes representing these programs and processing conditions may be stored in a hard disk or a semiconductor memory. Further, the recipes may be set at a predetermined position in the state of being stored in a storage medium readable by a portable computer such as, for example, a CD-ROM or a DVD so as to be read out.

For example, the controller 100 controls each unit of the plasma processing apparatus 1 so as to perform a plasma processing method described above.

Furthermore, the substrate processing apparatus according to the present disclosure is applicable not only to a capacitively coupled plasma (CCP) apparatus, but also to other substrate processing apparatuses. The other substrate processing apparatuses may be, for example, an inductively coupled plasma (ICP) apparatus, a plasma processing apparatus using a radial line slot antenna, a helicon wave plasma (HWP) apparatus, and an electron cyclotron resonance (ECR) plasma apparatus.

According to the present disclosure, it is possible to improve LCDU.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a chamber having a gas inlet and a gas outlet;
   a substrate support disposed in the chamber;
   a plasma generator configured to form a plasma in the chamber;
   a controller configured to control the apparatus to perform a plasma processing comprising:
   (a) placing a substrate on the substrate support, the substrate including a processing target having a plurality of openings including a first opening and a second opening, the first opening having an opening size different from an opening size of the second opening;
   (b) depositing a film on side surfaces of the openings under a processing condition which forms portions with different etch rates and in which an etching rate decreases as a distance from the side surfaces increases and a deposited amount on side surfaces of the openings varies according to sizes of the openings; and
   (c) etching the processing target after depositing the film, thereby causing a difference in the opening size between the first opening and the second opening to be reduced.

2. The plasma processing apparatus according to claim 1, wherein the controller is configured to control the apparatus such that depositing of the film includes changing a supply ratio of a plurality of gases to deposit the film with a continuously varying etching rate.

3. The plasma processing apparatus according to claim 2, wherein the controller is configured to control the apparatus to change the supply ratio by increasing an oxygen content of the gases.

4. The plasma processing apparatus according to claim 3, wherein the controller is configured to control the apparatus to:
   repeat (b) and (c) until a predetermined condition is satisfied.

5. The plasma processing apparatus according to claim 1, wherein the controller is configured to control the apparatus to:
   repeat (b) and (c) until a predetermined condition is satisfied.

6. The plasma processing apparatus according to claim 1, wherein the controller is configured to control the apparatus such that in depositing of the film a first film is formed and a second film is formed over the first film, and to perform the etching after forming the second film.

7. The plasma processing apparatus according to claim 6, wherein the controller is configured to control the apparatus during the etching to etch through a portion of the second film so that a portion of the first film is exposed through the second film, and after the portion of the first film is exposed, to continue etching.

8. The plasma processing apparatus according to claim 1, wherein the controller is further configured to control the apparatus to modify the film after depositing of the film and before the etching.

9. The plasma processing apparatus according to claim 1, wherein the controller controls the apparatus such that depositing the film reduces the difference in the opening size between the first opening and the second opening, and the etching further reduces the difference in the opening size between the first opening and the second opening.

10. A plasma processing apparatus comprising:
   a chamber having a gas inlet and a gas outlet;
   a substrate support disposed in the chamber;
   a plasma generator configured to form a plasma in the chamber;
   a controller configured to control the apparatus to perform a plasma processing comprising:
   (a) placing a substrate on the substrate support, the substrate including a processing target and a pattern having a plurality of openings including a first opening and a second opening, the first opening having an opening size different from an opening size of the second opening;
   (b) forming a first film on the pattern;
   (c) forming a second film on the first film, the second film having an etching rate lower than that of the first film, and the second film having different film thicknesses on side surfaces of the openings according to sizes of the openings; and
   (d) etching the second film under a predetermined processing condition until a portion of the first film is removed, thereby causing a difference in the opening size between the first opening and the second opening to be reduced.

11. The plasma processing apparatus according to claim 10, wherein the controller is configured to control the apparatus such that forming of the first film includes depositing a material of the first film and modifying the material to form the first film with an etching rate higher than that of the second film.

12. The plasma processing apparatus according to claim 11, wherein the controller is configured to control the apparatus to expose the material to the plasma to modify the material of the first film.

13. The plasma processing apparatus according to claim 10, wherein the controller is configured to control the apparatus to form the second film by modifying a portion of a material of the first film to form the second film.

14. The plasma processing apparatus according to claim 13, wherein the controller is configured to control the apparatus to modify the portion of the material of the first film by exposing the material of the first film to a plasma under a processing condition in which (i) a depth from a surface of the material which is modified by the plasma is greater in an opening having a larger size, or (ii) a degree of the modification of the material is greater in an opening having a larger size.

15. The plasma processing apparatus according to claim 14, wherein, the controller is configured to control the apparatus such that in the etching of the second film, the predetermined processing condition is changed from a first processing condition to a second processing condition at a time when the first film is exposed in at least a portion of the processing target.

16. The plasma processing apparatus according to claim 15, wherein the controller is configured to control the apparatus to:
repeat (b) to (d) until a predetermined condition is satisfied.

17. The plasma processing apparatus according to claim 10, wherein, the controller is configured to control the apparatus such that in the etching of the second film, the predetermined processing condition is changed from a first processing condition to a second processing condition at a time when the first film is exposed in at least a portion of the processing target.

18. The plasma processing apparatus according to claim 10, wherein the controller is configured to control the apparatus to:
repeat (b) to (d) at least until the first film is exposed.

19. The plasma processing apparatus according to claim 10, wherein the controller is configured to control the apparatus such that the difference in opening size between the first opening and the second opening is reduced after the forming of the second film compared to prior to forming of the first film, and the difference in opening size is further reduced after the etching of the second film.

20. The plasma processing apparatus of claim 10, wherein the controller is configured to control the apparatus so that the forming of the first and second films reduces the difference in the opening size between the first opening and the second opening, and so that the etching further reduces the difference in the opening size between the first opening and the second opening.

* * * * *